United States Patent
Nishimura et al.

(10) Patent No.: US 8,045,300 B2
(45) Date of Patent: Oct. 25, 2011

(54) TUNNELING MAGNETIC SENSING ELEMENT AND METHOD FOR PRODUCING SAME

(75) Inventors: Kazumasa Nishimura, Niigata-ken (JP); Yosuke Ide, Niigata-ken (JP); Naoya Hasegawa, Niigata-ken (JP); Masamichi Saito, Niigata-ken (JP); Yoshihiro Nishiyama, Niigata-ken (JP); Ryo Nakabayashi, Niigata-ken (JP); Hidekazu Kobayashi, Niigata-ken (JP)

(73) Assignee: TDK Corporation, Tokyo (JP)

( * ) Notice: Subject to any disclaimer, the term of this patent is extended or adjusted under 35 U.S.C. 154(b) by 892 days.

(21) Appl. No.: 12/036,513

(22) Filed: Feb. 25, 2008

(65) Prior Publication Data
US 2008/0225443 A1    Sep. 18, 2008

(30) Foreign Application Priority Data

Mar. 14, 2007  (JP) .................................. 2007-065614

(51) Int. Cl.
*G11B 5/39* (2006.01)
(52) U.S. Cl. ................. 360/324.2; 360/324.12
(58) Field of Classification Search ........ 360/324–324.2
See application file for complete search history.

(56) References Cited

U.S. PATENT DOCUMENTS

| | | | | |
|---|---|---|---|---|
| 7,333,306 B2 * | 2/2008 | Zhao et al. | | 360/324.12 |
| 7,746,602 B2 * | 6/2010 | Gill | | 360/324.12 |
| 7,746,603 B2 * | 6/2010 | Gill | | 360/324.12 |
| 7,751,156 B2 * | 7/2010 | Mauri et al. | | 360/324.2 |
| 7,791,845 B2 * | 9/2010 | Mauri et al. | | 360/324.2 |
| 7,813,088 B2 * | 10/2010 | Tsunekawa et al. | | 360/324.12 |
| 2007/0047159 A1 * | 3/2007 | Zhao et al. | | 360/324.12 |
| 2007/0297090 A1 * | 12/2007 | Gill | | 360/123 |
| 2008/0080101 A1 * | 4/2008 | Mauri et al. | | 360/324.2 |
| 2008/0144235 A1 * | 6/2008 | Gill | | 360/324.12 |
| 2008/0151442 A1 * | 6/2008 | Mauri et al. | | 360/324.12 |
| 2008/0192388 A1 * | 8/2008 | Zhang et al. | | 360/324 |
| 2009/0122450 A1 * | 5/2009 | Wang et al. | | 360/324.2 |
| 2009/0325319 A1 * | 12/2009 | Horng et al. | | 438/3 |
| 2010/0009467 A1 * | 1/2010 | Horng et al. | | 438/3 |

FOREIGN PATENT DOCUMENTS

| | | |
|---|---|---|
| JP | 2002-141583 | 5/2002 |
| JP | 2004-179667 | 6/2004 |
| JP | 2005-197764 | 7/2005 |

* cited by examiner

*Primary Examiner* — Will J Klimowicz
(74) *Attorney, Agent, or Firm* — Brinks Hofer Gilson & Lione

(57) ABSTRACT

A free magnetic layer has a laminated structure in which a first magnetic sublayer composed of Co—Fe or Fe and a second magnetic sublayer composed of Co—Fe—B or Fe—B are formed, in that order, on an insulating barrier layer composed of Mg—O. This effectively improves the rate of change in resistance ($\Delta R/R$) compared with the related art.

7 Claims, 7 Drawing Sheets

- ◆ $Co_{50}Fe_{50}(t3)$: REFERENCE EXAMPLE 1
- ■ $Co_{50}Fe_{50}(10)/Ni_{87}Fe_{13}(t2)$: RELATED EXAMPLE
- ● $Co_{50}Fe_{50}(10)/(Co_{50}Fe_{50})_{70}B_{30}(t1)$: EXAMPLE 1
- ▲ $(Co_{50}Fe_{50})_{80}B_{20}(t4)$: REFERENCE EXAMPLE 2

TUNNELING MAGNETIC SENSING ELEMENT AND METHOD FOR PRODUCING SAME

CLAIM FOR PRIORITY

This application claims benefit of the Japanese Patent Application No. 2007-065614 filed on Mar. 14, 2007, which is hereby incorporated by reference in its entirety.

BACKGROUND

1. Field of Invention

The present invention relates to tunneling magnetic sensing elements including an insulating barrier layer composed of Mg—O. In particular, the present invention relates to a tunneling magnetic sensing element having an effectively improved rate of change in resistance ($\Delta R/R$) compared with that in the related art, and a method for producing the tunneling magnetic sensing element.

2. Description of the Related Art

Tunneling magnetic sensing elements (tunneling magnetoresistive (TMR) elements) exhibits a change in resistance due to the tunneling effect. When the magnetization direction of a pinned magnetic layer is antiparallel to that of a free magnetic layer, a tunneling current does not flow easily through an insulating barrier layer (tunnel barrier layer) between the pinned magnetic layer and the free magnetic layer; hence, the resistance is maximized. On the other hand, when the magnetization direction of the pinned magnetic layer is parallel to that of the free magnetic layer, the tunneling current flows easily; hence, the resistance is minimized.

A change in electrical resistance due to a change in the magnetization of the free magnetic layer affected by an external magnetic field is detected as a change in voltage on the basis of this principle to detect a leakage field from a recording medium.

Japanese Unexamined Patent Application Publication Nos. 2004-179667, 2002-141583, and 2005-197764 are examples of the related art.

Changing the material of the insulating barrier layer changes characteristics, such as the rate of change in resistance ($\Delta R/R$). Thus, studies have been conducted on insulating barrier layer materials.

For example, in the case of an insulating barrier layer composed of Mg—O, a free magnetic layer has been used, which has a laminated structure with a NiFe sublayer and a CoFe sublayer that is located between the NiFe sublayer and the insulating barrier layer In the above-described structure, however, a sufficient rate of change in resistance ($\Delta R/R$) has not been obtained. To achieve higher recording density, further improvement in the rate of change in resistance ($\Delta R/R$) has been required.

SUMMARY

A tunneling magnetic sensing element includes a pinned magnetic layer, an insulating barrier layer, and a free magnetic layer, formed in that order from the bottom, or a free magnetic layer, an insulating barrier layer, and a pinned magnetic layer, formed in that order from the bottom. The insulating barrier layer is composed of Mg—O. The free magnetic layer has a first magnetic region and a second magnetic region. The first magnetic region is in contact with the insulating barrier layer, located between the second magnetic region and the insulating barrier layer, and composed of Co—Fe or Fe. The second magnetic region is remote from the insulating barrier layer, in contact with the first magnetic region, and composed of Co—Fe—B or Fe—B.

Alternatively, a tunneling magnetic sensing element includes a pinned magnetic layer, an insulating barrier layer, and a free magnetic layer, formed in that order from the bottom, or a free magnetic layer, an insulating barrier layer, and a pinned magnetic layer, formed in that order from the bottom. The insulating barrier layer is composed of Mg—O. The free magnetic layer has a magnetic region composed of Co—Fe—B or Fe—B. The magnetic region is in contact with the insulating barrier layer. The B concentration at a portion of the magnetic region adjacent to the interface between the free magnetic layer and the insulating barrier layer is lower than that at a portion of the magnetic region remote from the interface.

Alternatively, a tunneling magnetic sensing element according to the present invention includes a pinned magnetic layer, an insulating barrier layer, and a free magnetic layer, formed in that order from the bottom, or a free magnetic layer, an insulating barrier layer, and a pinned magnetic layer, formed in that order from the bottom. The insulating barrier layer is composed of Mg—O. The free magnetic layer includes a first magnetic sublayer and a second magnetic sublayer. The first magnetic sublayer is in contact with the insulating barrier layer, located between the second magnetic sublayer and the insulating barrier layer, and composed of Co—Fe or Fe. The second magnetic sublayer is remote from the insulating barrier layer, in contact with the first magnetic sublayer, and composed of Co—Fe—B or Fe—B.

A method for producing a tunneling magnetic sensing element according to the present invention, including a laminated portion having a pinned magnetic layer, an insulating barrier layer, and a free magnetic layer, formed in that order from the bottom, includes: forming the insulating barrier layer composed of Mg—O on the pinned magnetic layer; forming the free magnetic layer on the insulating barrier layer in such a manner that the free magnetic layer includes a laminated portion having a first magnetic sublayer and a second magnetic sublayer, formed in that order from the bottom, the first magnetic sublayer being in contact with the insulating barrier layer and composed of Co—Fe or Fe, and the second magnetic sublayer being in contact with the first magnetic sublayer and composed of Co—Fe—B or Fe—B; and performing heat treatment.

Alternatively, a method for producing a tunneling magnetic sensing element according to the invention, including a laminated portion having a free magnetic layer, an insulating barrier layer, and a pinned magnetic layer, formed in that order from the bottom, includes: forming the free magnetic layer including a laminated portion having a second magnetic sublayer and a first magnetic sublayer, formed in that order from the bottom, the second magnetic sublayer being composed of Co—Fe—B or Fe—B, and the first magnetic sublayer being in contact with the second magnetic sublayer and composed of Co—Fe or Fe; forming the insulating barrier layer composed of Mg—O on the first magnetic sublayer and forming the pinned magnetic layer on the insulating barrier layer; and performing heat treatment.

Thereby, a tunneling magnetic sensing element having a stable, high rate of change in resistance ($\Delta R/R$) is produced simply and appropriately.

DESCRIPTION OF THE EMBODIMENTS

Figure 1:
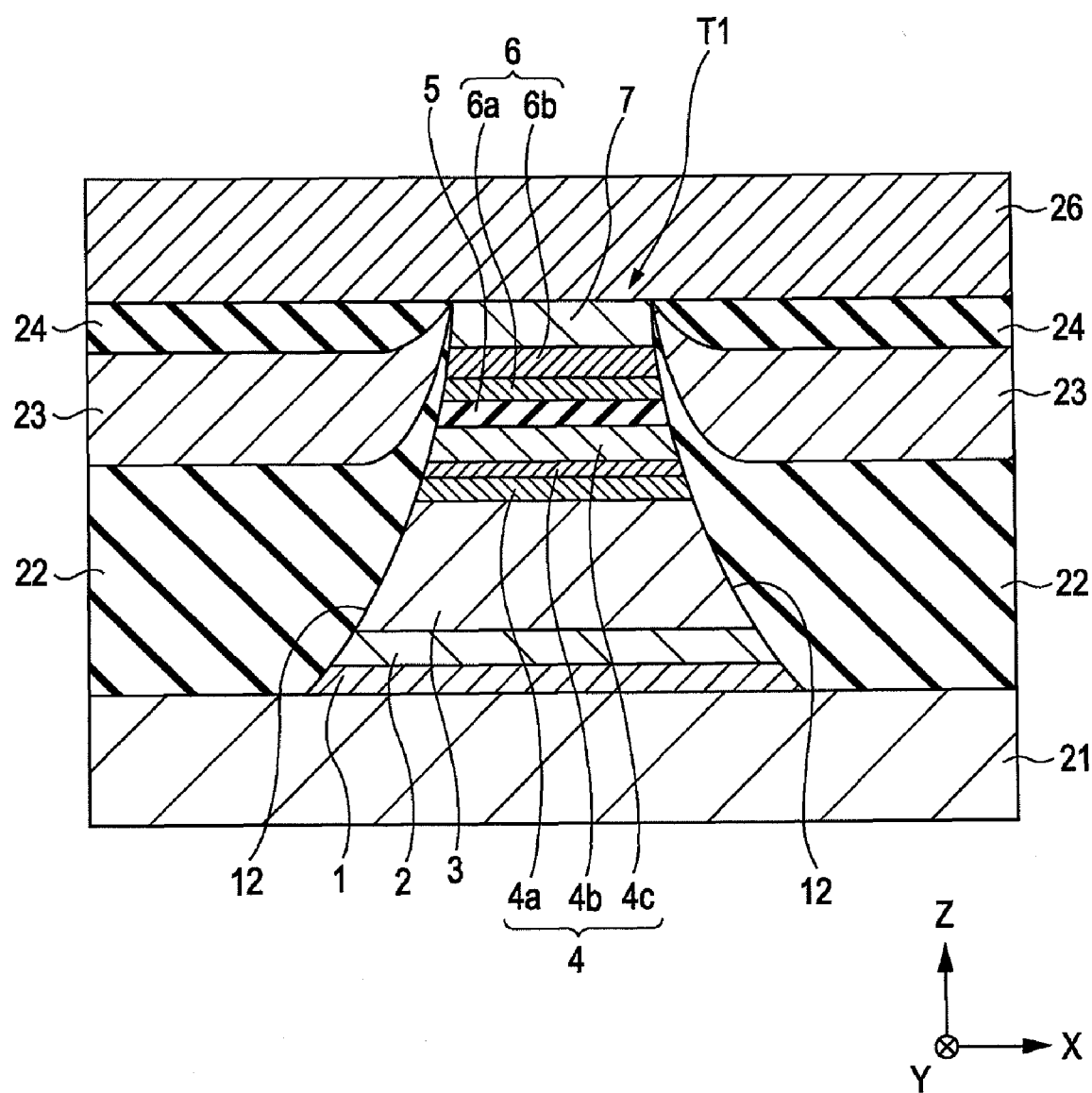
FIG. 1 is a cross-sectional view of a tunneling magnetic sensing element, the view being taken along a plane parallel to a face facing a recording medium.

FIG. 1 is a cross-sectional view of a tunneling magnetic sensing element according to an embodiment, the view being taken along a plane parallel to a face facing a recording medium.

The tunneling magnetic sensing element is mounted on a trailing end of a floating slider included in a hard disk drive or the like and detects a magnetic leakage field (recording magnetic field) from a magnetic recording medium. In each drawing, the X direction indicates a track width direction. The Y direction indicates the direction of a magnetic leakage field from a magnetic recording medium (height direction). The Z direction indicates the direction of motion of a magnetic recording medium and also indicates the stacking direction of layers in the tunneling magnetic sensing element.

In FIG. 1, the lowermost layer is a bottom shield layer 21 composed of Ni—Fe or the like. A laminate T1 is arranged on the bottom shield layer 21. The tunneling magnetic sensing element includes the laminate T1, lower insulating layers 22, hard bias layers 23, and upper insulating layers 24 arranged on both sides of the laminate T1 in the track width direction (X direction in the figure).

The lowermost layer of the laminate T1 is an underlying layer 1 composed of at least one nonmagnetic element selected from Ta, Hf, Nb, Zr, Ti, Mo, and W. The underlying layer 1 is overlaid with a seed layer 2. The seed layer 2 is composed of, for example, Ni—Fe—Cr, Cr, or Ru. The seed layer 2 may have a single-layer structure and also have a laminated structure with sublayers composed of different materials. The underlying layer 1 need not necessarily be formed.

The seed layer 2 is overlaid with an antiferromagnetic layer 3. The antiferromagnetic layer 3 is preferably composed of an antiferromagnetic material containing Mn and an element X that is at least one element selected from Pt, Pd, Ir, Rh, Ru, and Os.

Alternatively, the antiferromagnetic layer 3 may be composed of an antiferromagnetic material containing Mn, the element X, and an element X' that is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare-earth elements.

The antiferromagnetic layer 3 is composed of, for example, Ir—Mn.

The antiferromagnetic layer 3 is overlaid with a pinned magnetic layer 4. The pinned magnetic layer 4 has a multilayered ferrimagnetic structure including a first pinned magnetic sublayer 4a, a nonmagnetic intermediate sublayer 4b, and a second pinned magnetic sublayer 4c, formed in that order from the bottom. The magnetization direction of the first pinned magnetic sublayer 4a is antiparallel to that of the second pinned magnetic sublayer 4c because of the presence of an exchange coupling magnetic field at the interface between the antiferromagnetic layer 3 and the pinned magnetic layer 4 and an antiferromagnetic exchange coupling magnetic field (RKKY interaction) via the nonmagnetic intermediate sublayer 4b. The multilayered ferrimagnetic structure of the pinned magnetic layer 4 results in stable magnetization of the pinned magnetic layer 4 and apparently increases the exchange coupling magnetic field generated at the interface between the pinned magnetic layer 4 and the antiferromagnetic layer 3. The first pinned magnetic sublayer 4a and the second pinned magnetic sublayer 4c each have a thickness of about 12 to 40 Å. The nonmagnetic intermediate sublayer 4b has a thickness of about 8 to 10 Å.

The first pinned magnetic sublayer 4a is composed of Co—Fe or the like. The second pinned magnetic sublayer 4c is composed of Co—Fe—B, Fe—B, or the like. The second pinned magnetic sublayer 4c has a composition of $\{Co_{100-\alpha}Fe_{\alpha}\}_{100-\beta}B_{\beta}$, where $\alpha$ represents an atomic ratio and is in the range of about 25 to about 100, and $\beta$ represents a B concentration and is in the range of about 10 to about 30 at %. The nonmagnetic intermediate sublayer 4b is composed of a nonmagnetic conductive material, such as Ru, Rh, Ir, Cr, Re, or Cu.

The pinned magnetic layer 4 is overlaid with an insulating barrier layer 5 composed of Mg—O (magnesium oxide). The Mg content of Mg—O is preferably in the range of about 40 to about 60 at %. The most preferred composition is $Mg_{50\,at\,\%}O_{50\,at\,\%}$.

A very thin Mg layer having a thickness of, for example, about 1 to about 6 Å may be arranged between the insulating barrier layer 5 and the second pinned magnetic sublayer 4c.

The insulating barrier layer 5 is overlaid with a free magnetic layer 6. The free magnetic layer 6 has a laminated structure with a first magnetic sublayer 6a composed of Co—Fe or Fe and a second magnetic sublayer 6b which is arranged on the first magnetic sublayer 6a and which is composed of Co—Fe—B or Fe—B, formed in that order from the bottom.

A track width Tw is determined by the width of the free magnetic layer 6 in the track width direction (X direction in the figure).

The free magnetic layer 6 is overlaid with a protective layer 7 composed of Ta or the like.

Both end faces 12 of the laminate T1 in the track width direction (X direction in the figure) are inclined planes such that the width of the laminate T1 in the track width direction is gradually reduced with height.

As shown in FIG. 1, the lower insulating layers 22 are disposed on the bottom shield layer 21 that extends toward both sides of the laminate T1 and in contact with the end faces 12 of the laminate T1. The hard bias layers 23 are disposed on the lower insulating layers 22. The upper insulating layers 24 are disposed on the hard bias layers 23.

Bias underlying layers (not shown) may be disposed between the lower insulating layers 22 and the hard bias layers 23. The bias underlying layers are composed of Cr, W, Ti, or the like.

The lower and upper insulating layers 22 and 24 are each composed of an insulating material, such as $Al_2O_3$ or $SiO_2$. The insulating layers 22 and 24 insulate the hard bias layers 23 in such a manner that a current flowing through the laminate T1 in the direction perpendicular to interfaces between the layers is not diverted to both sides of the laminate T1 in the track width direction. The hard bias layers 23 are composed of a Co—Pt (cobalt-platinum) alloy, a Co—Cr—Pt (cobalt-chromium-platinum) alloy, or the like.

The laminate T1 and the upper insulating layers 24 are overlaid with a top shield layer 26 composed of NiFe or the like.

In the embodiment shown in FIG. 1, the bottom shield layer 21 and the top shield layer 26 each function as an electrode layer. A current flows in the direction perpendicular to surfaces of the layers of the laminate T1 (in the direction parallel to the Z direction in the figure).

A bias magnetic field from the hard bias layers 23 magnetizes the free magnetic layer 6 in the direction parallel to the track width direction (X direction in the figure). The first pinned magnetic sublayer 4a and the second pinned magnetic sublayer 4c constituting the pinned magnetic layer 4 are magnetized in the direction parallel to the height direction (Y direction in the figure). The magnetization direction of the first pinned magnetic sublayer 4a is antiparallel to that of the second pinned magnetic sublayer 4c because of the multilayered ferrimagnetic structure of the pinned magnetic layer 4. The magnetization direction of the pinned magnetic layer 4 is pinned, i.e., the magnetization direction is not changed by an external magnetic field. The magnetization direction of the free magnetic layer 6 varies in response to the external magnetic field.

In the case where the magnetization of the free magnetic layer 6 is changed by the external magnetic field, when the magnetization direction of the second pinned magnetic sublayer 4c is antiparallel to that of the free magnetic layer 6, a tunneling current does not easily flow through the insulating barrier layer 5 disposed between the second pinned magnetic sublayer 4c and the free magnetic layer 8, thereby maximizing electric resistance. On the other hand, when the magnetization direction of the second pinned magnetic sublayer 4c is parallel to that of the free magnetic layer 6, the tunneling current flows most easily to minimize electric resistance.

On the basis of this principle, a change in electric resistance due to a change in the magnetization of the free magnetic layer 6 affected by the external magnetic field is converted into a change in voltage to detect a leakage magnetic field from a magnetic recording medium.

Advantages of the tunneling magnetic sensing element according to this embodiment will be described below.

In this embodiment, the insulating barrier layer 5 is composed of Mg—O (magnesium oxide). The free magnetic layer 6 formed on the insulating barrier layer 5 has a laminated structure with the first and second magnetic sublayers 6a and 6b. The first magnetic sublayer 6a is in contact with the insulating barrier layer 5.

As a result of experiments described below, the foregoing structure effectively provides a high rate of change in resistance ($\Delta R/R$) compared with those in the Related Example in which a free magnetic layer having a laminated structure with a CoFe sublayer and a NiFe sublayer is formed, the CoFe sublayer being in contact with the insulating barrier layer, and the Reference Examples in which free magnetic layers are each a single Co—Fe layer or a single Co—Fe—B layer.

The product "element resistance R×element area A (RA)" is an extremely important factor to achieve proper high-speed data transfer and higher recording density. In this embodiment, even when RA is as low as about 3 to 4 $\Omega \cdot \mu m^2$, a large rate of change in resistance ($\Delta R/R$) is obtained.

Like the Related Example, in the case where the free magnetic layer having a laminated structure with a CoFe sublayer and a NiFe sublayer is formed, the CoFe sublayer being in contact with the insulating barrier layer, the NiFe sublayer before heat treatment (as-deposited state) has a face-centered cubic structure and readily exhibits the preferred orientation of equivalent crystal planes each typically expressed as the {111} plane in the plane parallel to the layer surfaces (X-Y plane). It is believed that the NiFe sublayer precludes an atomic rearrangement in the CoFe sublayer even when heat treatment is performed; hence, the preferred orientation of equivalent crystal planes each typically expressed as the {100} plane is not easily achieved at the interface between the CoFe sublayer and the insulating barrier layer 5 in the plane parallel to the layer surfaces (X-Y plane). Thus, the structure of the free magnetic layer in the Related Example does not provide a sufficiently high rate of change in resistance ($\Delta R/R$).

Like the Reference Example, in the case where the free magnetic layer is a single Co—Fe layer, a rate of change in resistance ($\Delta R/R$) higher than that in Related Example is obtained because of a high spin polarizability in the vicinity of the interface between the free magnetic layer and the insulating barrier layer 5. The CoFe layer is readily crystallized even when the CoFe layer is not subjected to heat treatment (as-deposited state). When the CoFe layer has a body-centered cubic structure, the CoFe layer readily exhibits the preferred orientation of equivalent crystal planes each typically expressed as the {110} plane in the plane parallel to the layer surfaces (X-Y plane). Thus, the preferred orientation of equivalent crystal planes each typically expressed as the {100} plane is not easily achieved at the interface between the CoFe layer and the insulating barrier layer in the plane parallel to the layer surfaces (X-Y plane) even when heat treatment is performed. A comparison of the Reference Example and this embodiment when the free magnetic layers have the same thickness shows that the rate of change in resistance ($\Delta R/R$) in the Reference Example is smaller than that in this embodiment. Furthermore, when the entire free magnetic layer is composed of Co—Fe, coercive force Hc and magnetostriction of the free magnetic layer increase disadvantageously.

Like the Reference Example, in the case where the free magnetic layer is a single Co—Fe—B layer, the CoFeB layer before heat treatment (as-deposition state) is predominantly in an amorphous state when the B concentration is adjusted to about 20 to about 30 at %. Ideally, it is preferred that the preferred orientation of equivalent crystal planes each typically expressed as the {100} plane is achieved at the interface between the CoFeB layer and the insulating barrier layer in the plane parallel to the layer surfaces (X-Y plane) by an atomic rearrangement after heat treatment. However, the structure in which the CoFeB layer is disposed on the insulating barrier layer 5 composed of Mg—O results in an increase in crystallization temperature. Specifically, heat treatment requires a temperature of 300° C. or higher.

A higher heat treatment temperature results in a reduction in the magnetization-pinning force of the pinned magnetic layer 4 (e.g., a reduction in exchange coupling magnetic field (Hex)) and an increase in interlayer coupling magnetic field (Hin) acting between the free magnetic layer 6 and the pinned magnetic layer 4, thereby disadvantageously reducing head reliability. When the heat treatment temperature is set at the same temperature as in the related art, for example, 270° C., a sufficient rate of change in resistance (ΔR/R) is not obtained probably because of insufficient crystallization of the CoFeB layer, as described in experimental results below.

In this embodiment, it is preferred that the preferred orientation of equivalent crystal planes each typically expressed as the {100} plane is achieved at the interface between the free magnetic layer 6 and the insulating barrier layer 5 in the plane parallel to the layer surfaces (X-Y plane). "The crystal planes each typically expressed as the {100} plane" refer to crystal lattice planes expressed in terms of Miller indices. The equivalent crystal planes each expressed as the {100} plane include the (100), (-100), (010), (0-10), (001), and (00-1) planes.

The second magnetic sublayer 6b composed of Co—Fe—B or Fe—B before heat treatment (as-deposited state) is predominantly in an amorphous state. Thus, an atomic rearrangement occurs readily in the first magnetic sublayer 6a, composed of Co—Fe or Fe, disposed on the insulating barrier layer 5 during heat treatment. Thereby, the atomic rearrangement occurs readily in the first magnetic sublayer 6a disposed on the insulating barrier layer 5 composed of Mg—O during heat treatment in such a manner that the preferred orientation of the equivalent crystal planes each typically expressed as the {100} plane is achieved in the plane parallel to the layer surfaces (X-Y plane).

The lattice mismatch at the interface between the second magnetic sublayer 6b and the first magnetic sublayer 6a is small. Thus, it is believed that the second magnetic sublayer 6b also exhibits the preferred orientation of the equivalent crystal planes each typically expressed as the {100} plane in the plane parallel to the layer surfaces (X-Y plane). Instead of the formation of the CoFeB layer on the insulating barrier layer 5 composed of Mg—O, the formation of the second magnetic sublayer 6b composed of Co—Fe—B or Fe—B on the first magnetic sublayer 6a composed of Co—Fe or Fe results in a reduction in the crystallization temperature of the second magnetic sublayer 6b. This structure appropriately promotes the crystallization of the second magnetic sublayer 6b even at the same heat treatment temperature as in the related art.

The second pinned magnetic sublayer 4c disposed on the nonmagnetic intermediate sublayer 4b composed of Ru or the like is composed of Co—Fe—B or Fe—B. The preferred orientation of equivalent crystal planes each typically expressed as the {100} plane is achieved at at least the interface between the second pinned magnetic sublayer 4c and the insulating barrier layer 5 in the plane parallel to the layer surfaces (X-Y plane) after heat treatment.

In this embodiment, it is more preferred that the preferred orientation of equivalent crystal planes each typically expressed as the {100} plane in the entirety of the second pinned magnetic sublayer 4c, the insulating barrier layer 5, and the first and second magnetic sublayers 6a and 6b be achieved in the plane parallel to the layer surfaces (X-Y plane in the figure).

Preferably, each of the second pinned magnetic sublayer 4c, and the first and second magnetic sublayers 6a and 6b has a body-centered cubic structure (bcc structure).

The insulating barrier layer 5 preferably has a sodium chloride structure.

The factors for the increase in the rate of change in resistance (ΔR/R) are believed to be the arrangement of the first magnetic sublayer 6a, composed of Co—Fe, having high spin polarizability so as to be in contact with the insulating barrier layer 5 in addition to the improvement of the crystal orientation.

In this embodiment, preferably, the total average thickness (the thickness of the entire free magnetic layer 6 in FIG. 1) of the average thickness of the first magnetic sublayer 6a and the average thickness of the second magnetic sublayer 6b is in the range of about 15 Å to about 80 Å. The first magnetic sublayer 6a preferably has an average thickness of about 5 Å to about 30 Å. The second magnetic sublayer 6b preferably has an average thickness of about 5 Å or more. This results in a stable, high rate of change in resistance (ΔR/R).

In this embodiment, more preferably, the total average thickness of the average thickness of the first magnetic sublayer 6a and the average thickness of the second magnetic sublayer 6b is in the range of about 20 Å to about 60 Å.

In this embodiment, more preferably, the first magnetic sublayer 6a has an average thickness of about 10 Å to about 20 Å.

In this embodiment, more preferably, the second magnetic sublayer 6b has an average thickness of about 10 Å or more.

Thereby, a stable, high rate of change in resistance (ΔR/R) is surely obtained.

In this embodiment, the first magnetic sublayer 6a has a composition of $Co_{100-v}Fe_v$. The Fe concentration v is preferably in the range of about 25 at % to 100 at % and more preferably about 25 at % to 90 at %.

In this embodiment, the second magnetic sublayer 6b has a composition of $\{Co_{100-y}Fe_y\}_{100-z}B_z$. The atomic ratio y is preferably in the range of about 25 to about 100 and more preferably about 25 to about 90. The B concentration z is preferably in the range of about 10 at % to about 30 at %.

The tunneling magnetic sensing element is subjected to heat treatment (annealing) in a production process described below. The heat treatment is performed at, for example, about 200° C. to about 290° C. An example of the heat treatment is annealing in a magnetic field in order to generate an exchange coupling magnetic field (Hex) between the antiferromagnetic layer 3 and the first pinned magnetic sublayer 4a constituting the pinned magnetic layer 4.

For example, when the heat treatment temperature is less than 200° C., constituent elements do not interdiffuse at the interface between the first magnetic sublayer 6a and the second magnetic sublayer 6b. Alternatively, a low degree of interdiffusion occurs (e.g., diffusion occurs not at the entire interface but at part of the interface). Thus, the interface is substantially maintained.

Figure 2:
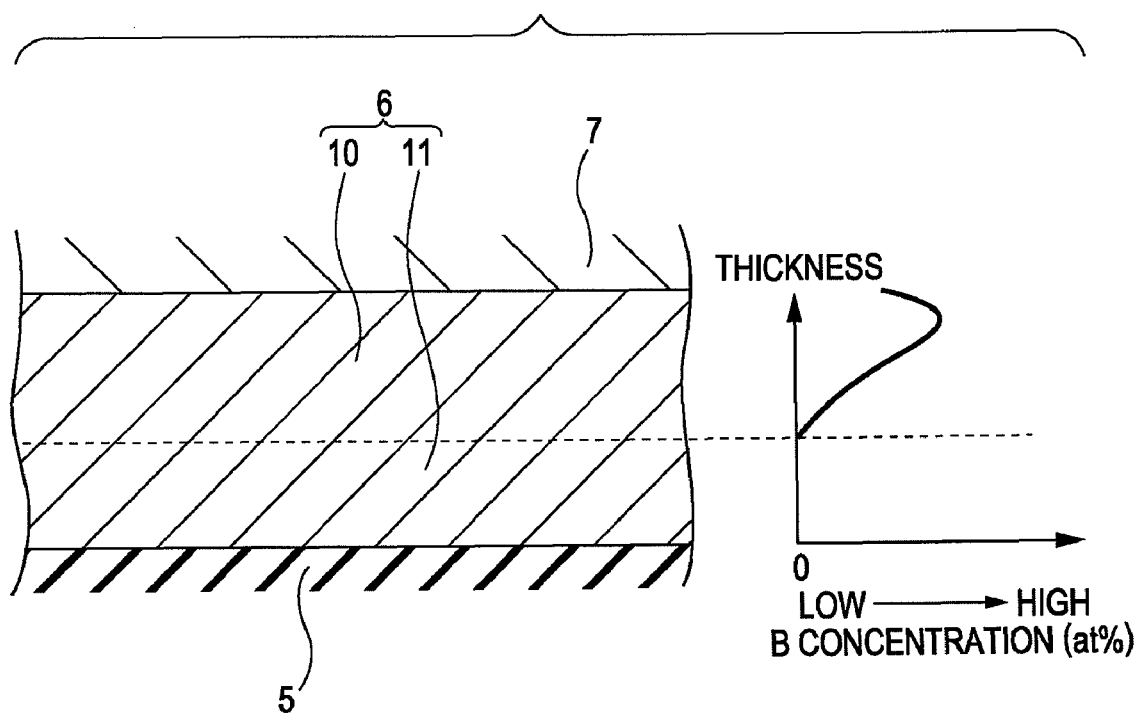
FIG. 2 is a fragmentary enlarged cross-sectional view of a free magnetic layer shown in FIG. 1 and a graph showing the compositional modulation for a B concentration in order to illustrate elemental diffusion at the interface between the first magnetic sublayer and the second magnetic sublayer.
Figure 3:
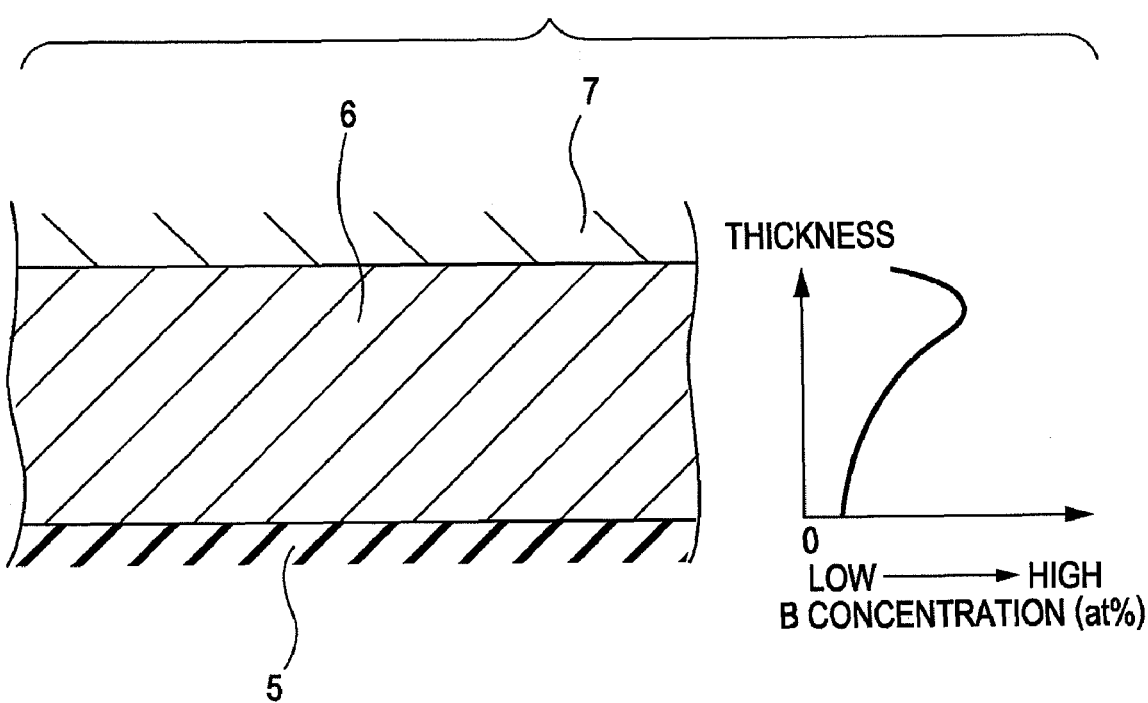
FIG. 3 is a fragmentary enlarged view of a free magnetic layer shown in FIG. 1 according to an embodiment different from that shown in FIG. 2 and is a graph showing the compositional modulation for a B concentration.

For example, when the heat treatment temperature is in the range of about 200° C. to about 290° C. and when the heat treatment period is one hour or more, as shown in FIG. 2 or 3, the constituent elements interdiffuse at the interface between the first magnetic sublayer 6a and the second magnetic sublayer 6b to eliminate the interface. Thereby, a compositionally modulated portion for the B concentration is formed.

In an embodiment shown in FIG. 2, the constituent elements interdiffuse at the interface between the first magnetic sublayer 6a and the second magnetic sublayer 6b. The free magnetic layer 6 has a second magnetic region 10 composed of Co—Fe—B or Fe—B and a first magnetic region 11, composed of Co—Fe or Fe, located between the second magnetic region 10 and the insulating barrier layer 5.

As shown in FIG. 2, the first magnetic region 11 does not contain B. As shown in the graph of FIG. 2, the second magnetic region 10 has a compositionally modulated portion where the B concentration decreases gradually as the distance from the interface between the free magnetic layer and the insulating barrier layer decreases. Furthermore, the B concentration near the top face of the second magnetic region 10 is lower than that on the inner side. This is attributed to elemental diffusion at the interface between the protective layer 7 and the second magnetic region 10.

In an embodiment shown in FIG. 3, the entire free magnetic layer 6 is composed of Co—Fe—B or Fe—B. The B concentration in a portion adjacent to the bottom face in contact with the insulating barrier layer 5 is smaller than that in a portion adjacent to the top face in contact with the protective layer 7. As shown in FIG. 3, the free magnetic layer 6 has a compositionally modulated portion where the B concentration decreases gradually from the top face in contact with the protective layer 7 to the bottom face in contact with the insulating barrier layer 5. Furthermore, the B concentration near the top face of the free magnetic layer 6 is lower than that on the inner side thereof. This is attributed to elemental diffusion at the interface between the protective layer 7 and the free magnetic layer 6.

It is speculated that the presence of the compositionally modulated portion also affects the crystal structure and the like to contribute to the improvement of the rate of change in resistance ($\Delta R/R$) and the like.

In this embodiment, the free magnetic layer 6 has the two-layer structure with the first magnetic sublayer 6a composed of Co—Fe or Fe and the second magnetic sublayer 6b composed of Co—Fe—B or Fe—B or has the structure obtained by elemental diffusion in the two-layer structure. Alternatively, the free magnetic layer 6 may be formed of three or more sublayers. For example, the free magnetic layer 6 may have a three-layer structure in which the second magnetic sublayer 6b is overlaid with a third magnetic sublayer or may have a structure obtained by elemental diffusion in the three-layer structure.

In the embodiment shown in FIG. 1, the antiferromagnetic layer 3, the pinned magnetic layer 4, the insulating barrier layer 5, and the free magnetic layer 6 are stacked in that order from the bottom. Alternately, the free magnetic layer 6, the insulating barrier layer 5, the pinned magnetic layer 4, and the antiferromagnetic layer 3 may be stacked in that order. In this case, the free magnetic layer 6 includes the second magnetic sublayer 6b and the first magnetic sublayer 6a stacked from the bottom. The insulating barrier layer 5 is in contact with the first magnetic sublayer 6a.

Alternatively, a dual tunneling magnetic sensing element including a lower antiferromagnetic layer, a lower pinned magnetic layer, a lower insulating barrier layer, a free magnetic layer, an upper insulating barrier layer, an upper pinned magnetic layer, and an upper antiferromagnetic layer stacked in that order from the bottom may be exemplified. In this case, preferably, the free magnetic layer includes a first magnetic sublayer composed of Co—Fe or Fe, a second magnetic sublayer composed of Co—Fe—B or Fe—B, and a first magnetic sublayer composed of Co—Fe or Fe stacked in that order from the bottom.

However, as shown in FIGS. 1 to 3, the structure with the antiferromagnetic layer 3, the pinned magnetic layer 4, the insulating barrier layer 5, and the free magnetic layer 6 stacked in that order from the bottom is preferred because a high rate of change in resistance ($\Delta R/R$) is effectively obtained compared with that in the related art, as is apparent from experimental results described below.

A method for producing a tunneling magnetic sensing element according to this embodiment will be described below. FIGS. 4 to 7 are cross-sectional views of a tunneling magnetic sensing element in the production process, each of the views being taken along the same plane as in FIG. 1.

Figure 4:
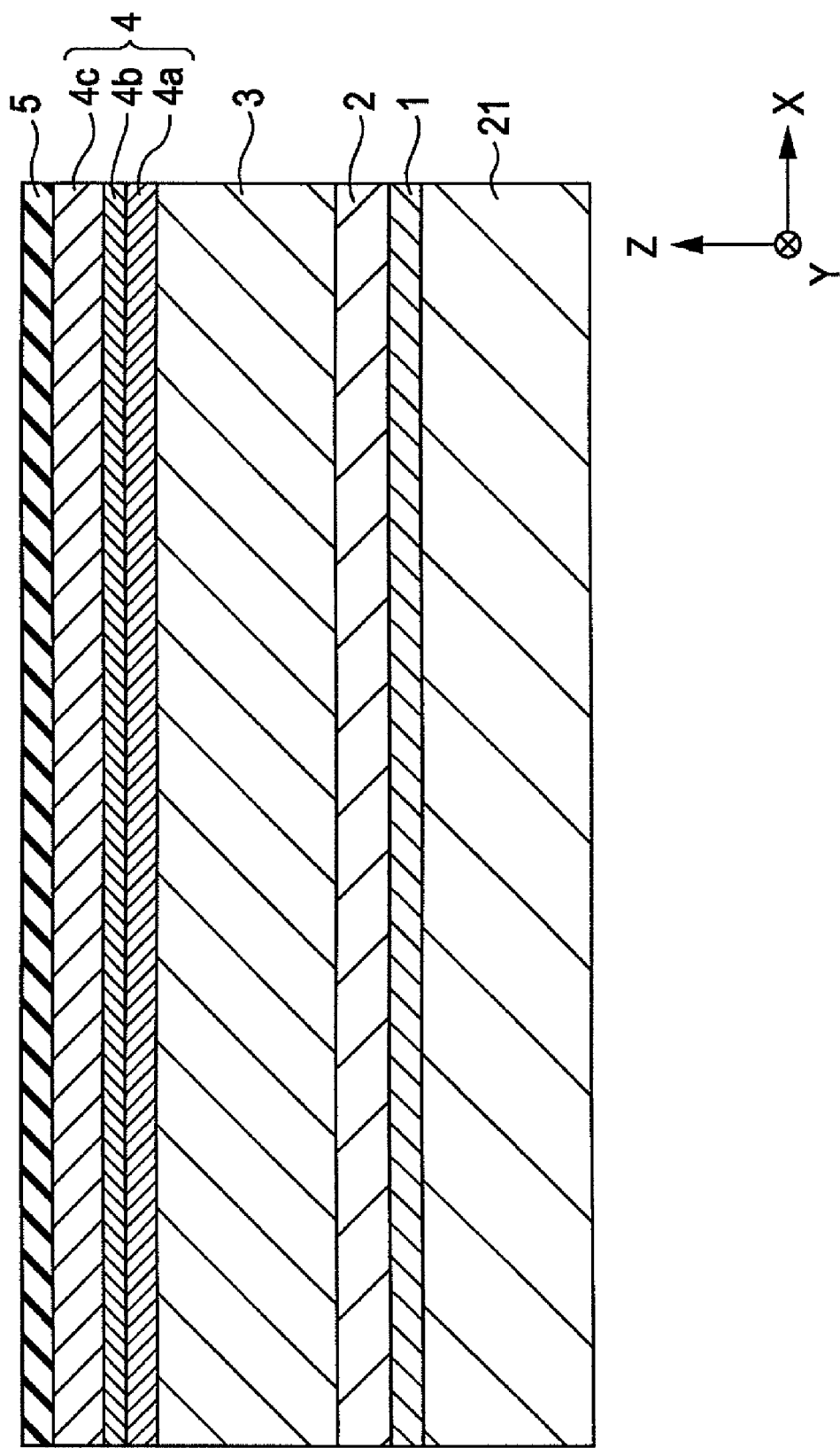
FIG. 4 is a process drawing of a method for producing a tunneling magnetic sensing element according to an embodiment (cross-sectional view of the tunneling magnetic sensing element during the production process, the view being taken along a plane parallel to a face facing a recording medium)

In a step shown in FIG. 4, the underlying layer 1, the seed layer 2, the antiferromagnetic layer 3, the first pinned magnetic sublayer 4a, the nonmagnetic intermediate sublayer 4b, the second pinned magnetic sublayer 4c, and the insulating barrier layer 5 are continuously formed, in that order from the bottom, on the bottom shield layer 21.

As shown in FIG. 4, the insulating barrier layer 5 composed of Mg—O (magnesium oxide) is formed on the second pinned magnetic sublayer 4c. For example, a target composed of Mg—O having a predetermined composition is prepared. The insulating barrier layer 5 composed of Mg—O is formed on the second pinned magnetic sublayer 4c by sputtering with the target.

Figure 5:
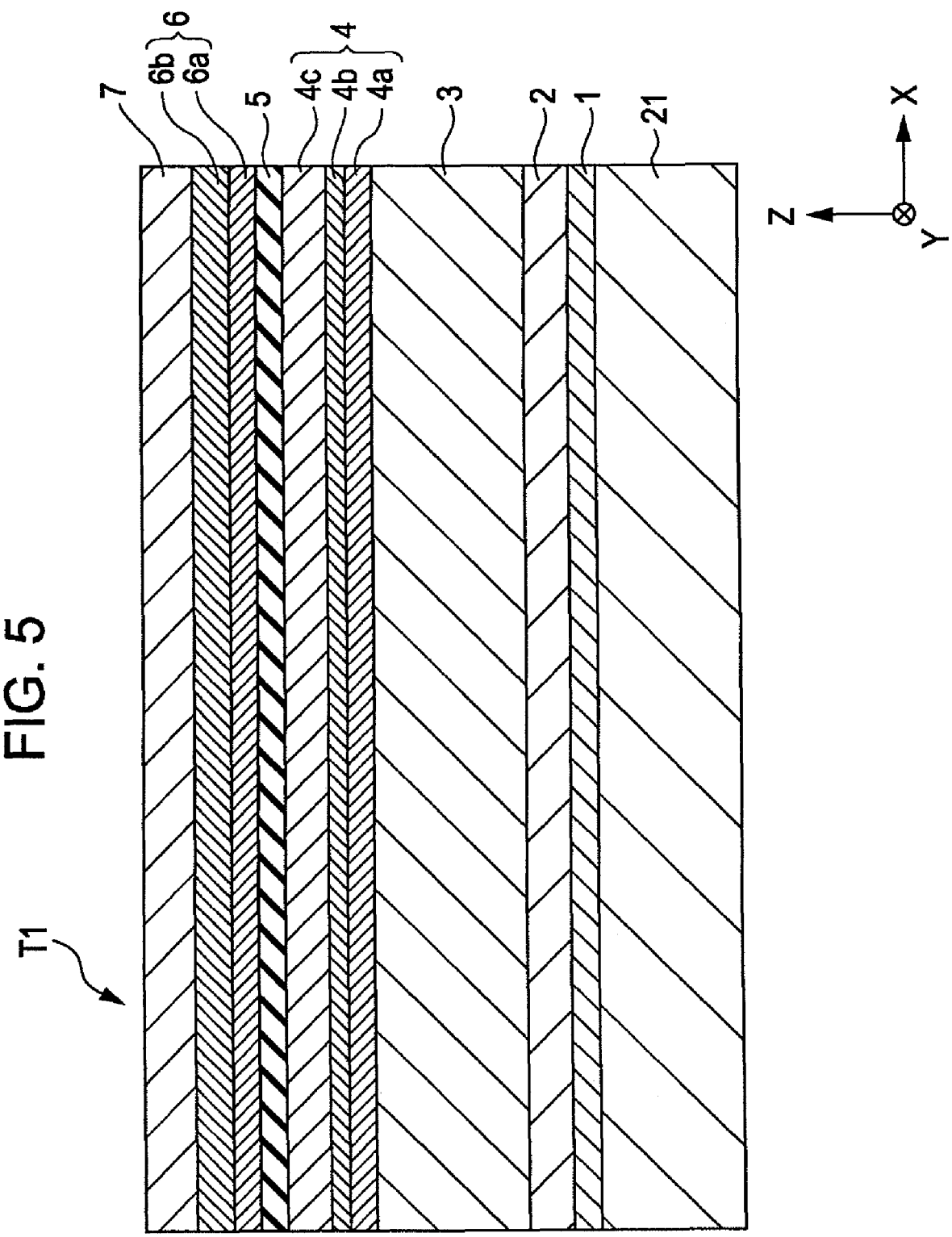
FIG. 5 is a process drawing showing a step subsequent to the step shown in FIG. 4 (cross-sectional view of the tunneling magnetic sensing element during the production process, the view being taken along a plane parallel to a face facing a recording medium)

As shown in FIG. 5, the first magnetic sublayer 6a composed of Co—Fe or Fe is formed on the insulating barrier layer 5 by sputtering. The second magnetic sublayer 6b composed of Co—Fe—B or Fe—B is formed on the first magnetic sublayer 6a by sputtering. In this embodiment, the first magnetic sublayer 6a and the second magnetic sublayer 6b constitute the free magnetic layer 6.

In this embodiment, preferably, the total average thickness obtained by the sum of the average thickness of the first magnetic sublayer 6a and the average thickness of the second magnetic sublayer 6b is in the range of about 15 Å to about 80 Å. In this case, the first magnetic sublayer 6a preferably has an average thickness of about 5 Å to about 30 Å, and the second magnetic sublayer 6b preferably has an average thickness of about 5 Å or more.

In this embodiment, more preferably, the total average thickness obtained by the sum of the average thickness of the first magnetic sublayer 6a and the average thickness of the second magnetic sublayer 6b is in the range of about 20 Å to about 60 Å.

In this embodiment, more preferably, the first magnetic sublayer 6a has an average thickness of about 10 Å to about 20 Å.

In this embodiment, more preferably the second magnetic sublayer 6b has an average thickness of about 10 Å or more.

By controlling the thickness as described above results, a tunneling magnetic sensing element having a stable, high rate of change in resistance ($\Delta R/R$) is produced simply and appropriately.

As shown in FIG. 5, the protective layer 7 is formed on the free magnetic layer 6 by sputtering. Thereby, the laminate T1 including the underlying layer 1 to the protective layer 7 stacked in sequence is formed.

Figure 6:
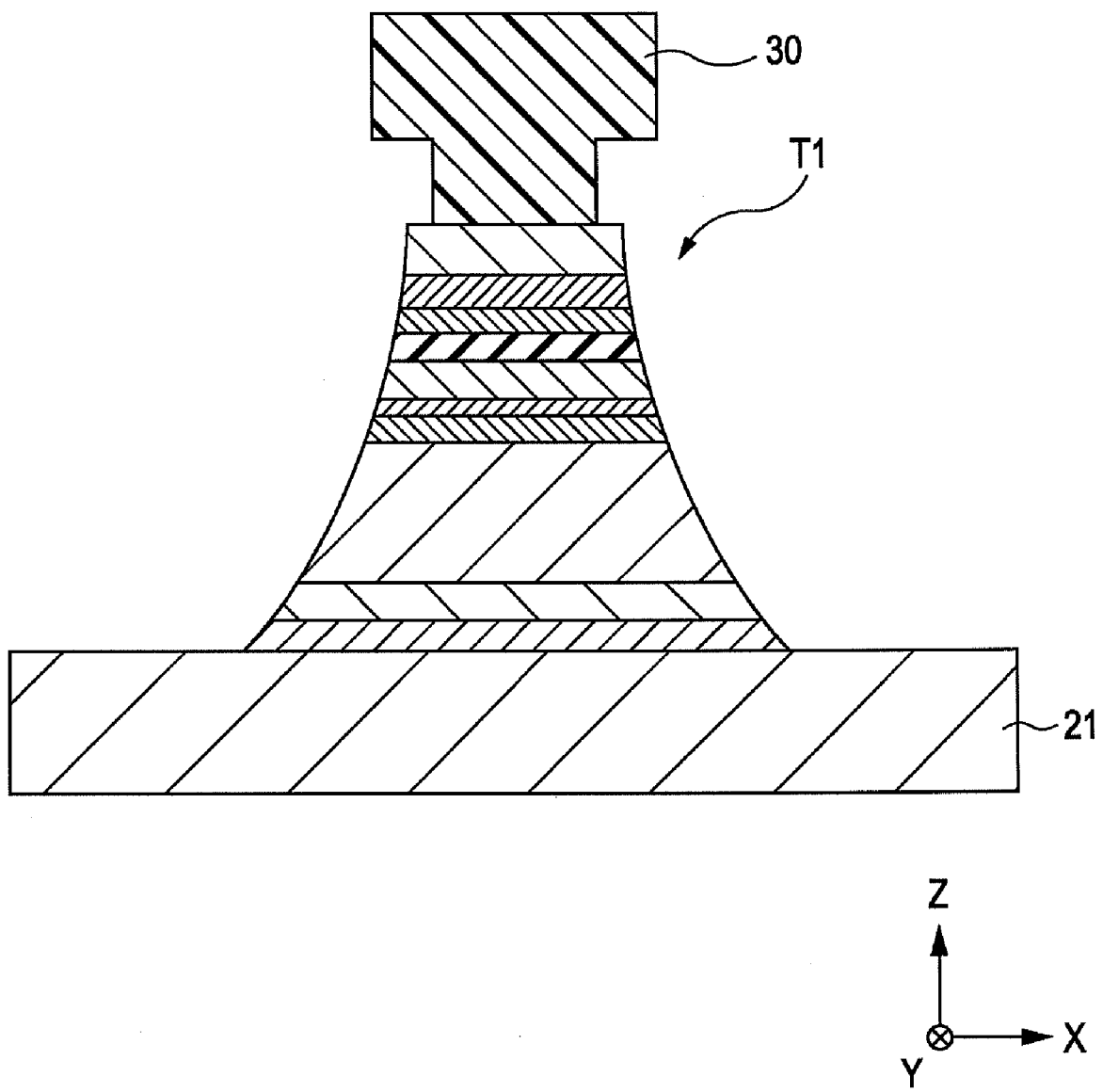
FIG. 6 is a process drawing showing a step subsequent to the step shown in FIG. 5 (cross-sectional view of the tunneling magnetic sensing element during the production process, the view being taken along a plane parallel to a face facing a recording medium)

A resist layer 30 used in a lift-off process is formed on the laminate T1. Referring to FIG. 6, both sides of the laminate T1 in the track width direction (X direction in the figure) which are not covered with the resist layer 30 are removed by etching or the like.

Figure 7:
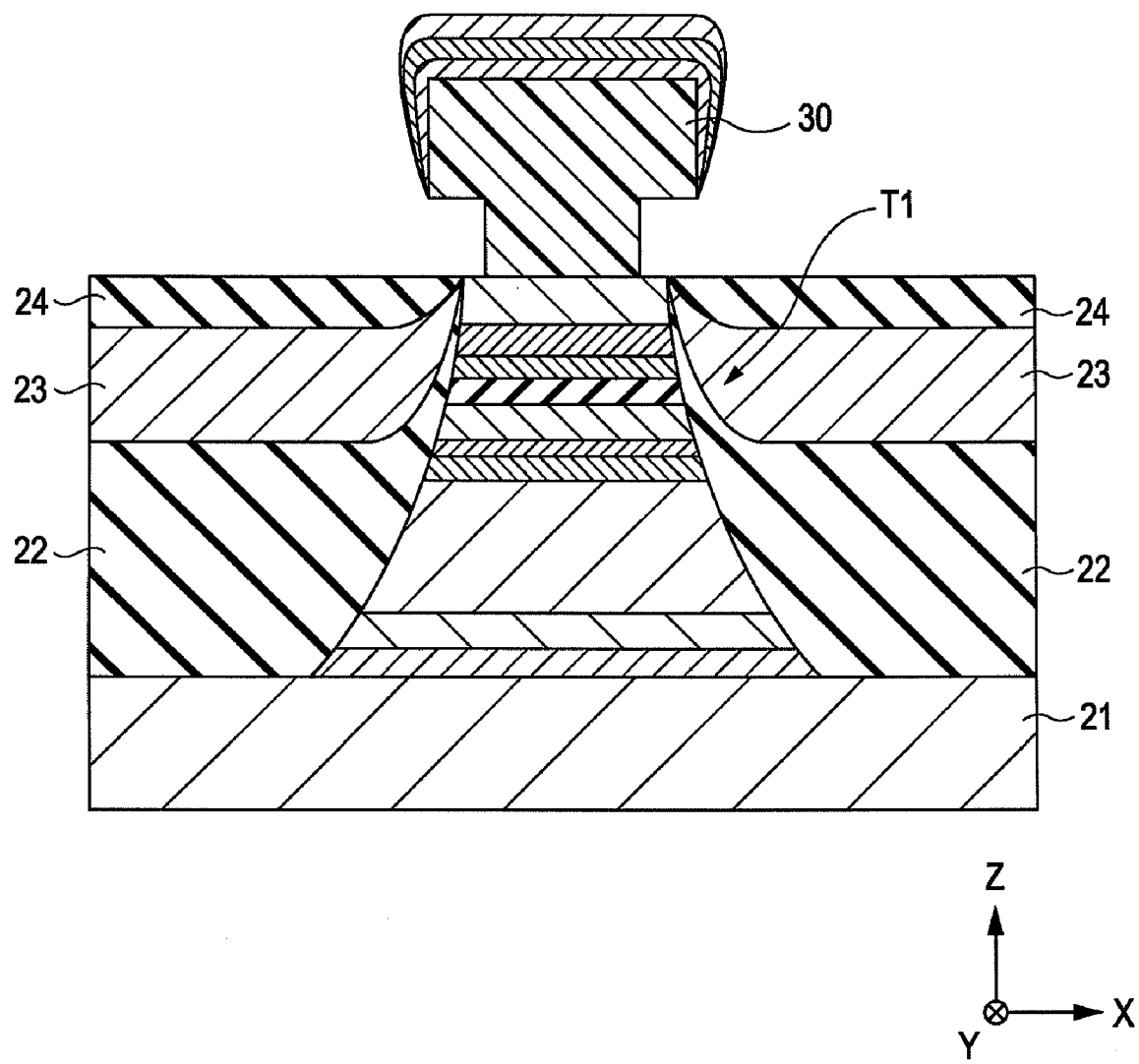
FIG. 7 is a process drawing showing a step subsequent to the step shown in FIG. 6 (cross-sectional view of the tunneling magnetic sensing element during the production process, the view being taken along a plane parallel to a face facing a recording medium)

Referring to FIG. 7, the lower insulating layers 22, the hard bias layers 23, and the upper insulating layers 24 are stacked in that order from the bottom on both sides of the laminate T1 in the track width direction (X direction in the figure) and on the bottom shield layer 21.

The resist layer 30 is removed by the lift-off process. The top shield layer 26 is formed on the laminate T1 and the upper insulating layers 24.

The method for producing the tunneling magnetic sensing element includes annealing after the formation of the laminate T1. An example of typical annealing is annealing to generate the exchange coupling magnetic field (Hex) between the antiferromagnetic layer 3 and the first pinned magnetic sublayer 4a.

For example, when the heat treatment temperature is lower than 200° C., constituent elements do not interdiffuse at interfaces between adjacent layers. Alternatively, a low degree of interdiffusion occurs (e.g., diffusion occurs not at the entire interface but at part of the interface). Thus, the interfaces are substantially maintained.

For example, when the heat treatment temperature is in the range of about 200° C. to about 290° C. and when the heat treatment period is one hour or more, the constituent elements interdiffuse at the interfaces between adjacent layers. This interdiffusion eliminates the interface between the first magnetic sublayer 6a and the second magnetic sublayer 6b in the free magnetic layer 6 as shown in FIGS. 2 and 3, thereby forming a compositionally modulated portion for the B concentration.

In this embodiment, with respect to tunneling magnetic sensing elements including the insulating barrier layers 5 composed of Mg—O, the tunneling magnetic sensing element having a high rate of change in resistance ($\Delta R/R$) compared with that in the related art is produced simply and appropriately by the above-described method.

To form the free magnetic layer 6 having the compositionally modulated portion for the B concentration as shown in FIGS. 2 and 3, the following method may be employed other than the above-described method: preparing targets composed of Co—Fe—B or Fe—B having different B concentrations, and forming the free magnetic layer 6 by sputtering while the targets are changed in such a manner that the B concentration increases gradually from the bottom face to the top face of the free magnetic layer 6.

The tunneling magnetic sensing element according to this embodiment may be used not only as a magnetic head in a hard disk drive but also as magnetoresistive random-access memory (MRAM) and a magnetic sensor.

Example 1

A tunneling magnetic sensing element as shown in FIG. 1 was formed.

A laminate T1 was formed so as to have the following structure: underlying layer 1; Ta (30)/seed layer 2; Ru (40)/antiferromagnetic layer 3; $Ir_{26\,at\,\%}Mn_{74\,at\,\%}$ (80)/pinned magnetic layer 4 [first pinned magnetic sublayer 4a; $Co_{70\,at\,\%}Fe_{30\,at\,\%}$ (22)/nonmagnetic intermediate sublayer 4b; Ru (9.1)/second pinned magnetic sublayer 4c; $\{Co_{50}Fe_{50}\}_{80\,at\,\%}B_{20\,at\,\%}$ (26)]/insulating barrier layer 5; Mg—O (11)/free magnetic layer 6/Ru (20)/protective layer 7; Ta (180), stacked in that order from the bottom.

In this experiment, the free magnetic layer 6 was formed so as to have the following structure: first magnetic sublayer; $Co_{50\,at\,\%}Fe_{50\,at\,\%}$ (10)/second magnetic sublayer; $\{Co_{50}Fe_{50}\}_{70\,at\,\%}B_{30\,at\,\%}$ (t1), stacked in that order from the bottom.

Each of the values in parentheses shown in the layers of the laminate T1 indicates an average thickness (unit: Å). The thickness of the entire free magnetic layer 6 in Example 1 was (10+t1) Å.

After formation of the laminate T1, the laminate T1 was subjected to annealing at 270° C. for three hours and 40 minutes.

Related Example

A laminate T1 was formed as in Example 1, except that the free magnetic layer had the following structure: $Co_{50\,at\,\%}Fe_{50\,at\,\%}$ (10)/$Ni_{87\,at\,\%}Fe_{13\,at\,\%}$ (t2), stacked in that order. In Related Example, thus, the thickness of the entire free magnetic layer was (10+t2) Å.

Reference Example 1

A laminate T1 was formed as in Example 1, except that the free magnetic layer had a single-layer structure of $Co_{50\,at\,\%}Fe_{50\,at\,\%}$ (t3). In Reference Example 1, thus, the thickness of the free magnetic layer was t3.

Reference Example 2

A laminate T1 was formed as in Example 1, except that the free magnetic layer had a single-layer structure of $\{Co_{50}Fe_{50}\}_{80\,at\,\%}B_{20\,at\,\%}$ (t4). In Reference Example 1, thus, the thickness of the free magnetic layer was t4.

Figure 8:
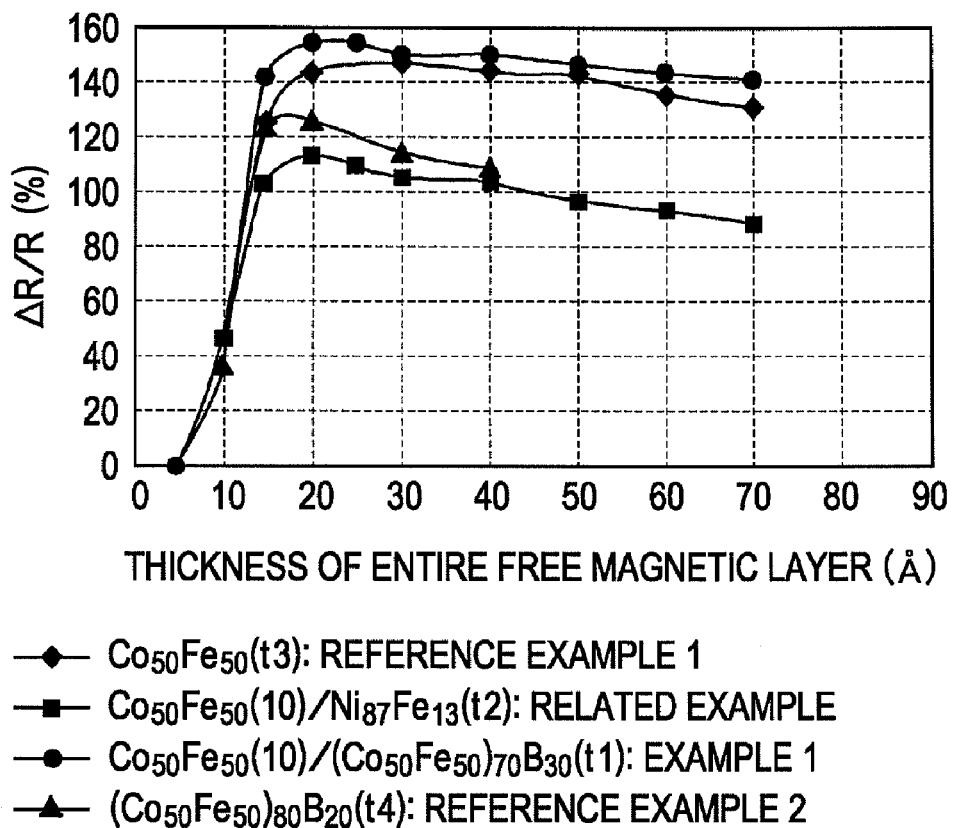
FIG. 8 is a graph showing the relationship between the rate of change in resistance ($\Delta R/R$) and the thickness of the entire free magnetic layer in each of Example, related Example, Reference Example 1 and Reference Example 2.

In this experiment, the relationship between the thickness of the entire free magnetic layer and the rate of change in resistance ($\Delta R/R$) of each tunneling magnetic sensing element was investigated by changing each of the average thicknesses t1 to t4. FIG. 8 shows the results.

The results demonstrated that, as shown in FIG. 8, the rate of change in resistance ($\Delta R/R$) of the tunneling magnetic sensing element in Example 1 was higher than those in the tunneling magnetic sensing elements in Related Example, Reference Examples 1 and 2.

As shown in FIG. 8, the results demonstrated that when the thickness of the entire free magnetic layer in Example 1 (the total average thickness obtained by the sum of the average thickness of the first magnetic sublayer and the average thickness of the second magnetic sublayer) was 15 Å or more, a high rate of change in resistance ($\Delta R/R$) was stably obtained. An excessively large thickness of the entire free magnetic layer results in an increase in magnetic moment per unit area (saturation magnetization Ms×thickness t), thereby reducing the sensitivity of the free magnetic layer to magnetic fields. Preferably, the maximum of the thickness of the entire free magnetic layer was 80 Å.

The experimental results shown in FIG. 8 demonstrated that when the thickness of the entire free magnetic layer was set in the range of 15 Å to 80 Å, the average thickness (t1) of the second magnetic sublayer was preferably set to 5 Å or more.

As shown in FIG. 8, the results also demonstrated that when the thickness of the entire free magnetic layer in Example 1 (the total average thickness obtained by the sum of the average thickness of the first magnetic sublayer and the average thickness of the second magnetic sublayer) was set in the range of 20 Å to 60 Å, a high rate of change in resistance ($\Delta R/R$) was obtained more stably.

The experimental results shown in FIG. 8 also demonstrated that more preferably, the average thickness (t1) of the second magnetic sublayer was set to 10 Å or more.

Example 2

A tunneling magnetic sensing element as shown in FIG. 1 was formed.

A laminate T1 was formed so as to have the following structure: underlying layer 1; Ta (30)/seed layer 2; Ru (40)/ antiferromagnetic layer 3; $Ir_{26\ at\%}Mn_{74\ at\%}$ (80)/pinned magnetic layer 4 [first pinned magnetic sublayer 4a; $Co_{70\ at\%}Fe_{30\ at\%}$ (22)/nonmagnetic intermediate sublayer 4b; Ru (9.1)/second pinned magnetic sublayer 4c; {$Co_{50}Fe_{50}$}$_{80\ at\%}$B$_{20\ at\%}$ (26)]/insulating barrier layer 5; Mg—O (11)/free magnetic layer 6/Ru (20)/protective layer 7; Ta (180), stacked in that order from the bottom.

In this experiment, the free magnetic layer 6 was formed so as to have the following structure: first magnetic sublayer; $Co_{50\ at\%}Fe_{50\ at\%}$ (t5)/second magnetic sublayer; {$Co_{50}Fe_{50}$}$_{70\ at\%}$B$_{30\ at\%}$ (20), stacked in that order from the bottom.

Each of the values in parentheses shown in the layers of the laminate T1 indicates an average thickness (unit: Å). After formation of the laminate T1, the laminate T1 was subjected to annealing at 270° C. for three hours and 40 minutes.

In this experiment, the relationship between the average thickness t5 of the first magnetic sublayer (Co—Fe) and the rate of change in resistance (ΔR/R) was investigated by changing the average thickness t5 of the first magnetic sublayer. Table 1 shows the average thicknesses of the first and second magnetic sublayers constituting the free magnetic layer, RA, and the rate of change in resistance (ΔR/R).

TABLE 1

| Free magnetic layer | | RA | ΔR/R |
|---|---|---|---|
| First magnetic sublayer (CoFe) | Second magnetic sublayer (CoFeB) | (Ω·μm$^2$) | (%) |
| 0 | 20 | 3.3 | 120.1 |
| 2 | 20 | 3.6 | 122.3 |
| 4 | 20 | 3.4 | 128.4 |
| 5 | 20 | 3.6 | 142.3 |
| 6 | 20 | 3.5 | 145.7 |
| 8 | 20 | 3.7 | 147.8 |
| 10 | 20 | 3.9 | 149.0 |
| 15 | 20 | 3.8 | 148.3 |
| 20 | 20 | 4.0 | 141.2 |
| 30 | 20 | 3.9 | 136.7 |

Figure 9:
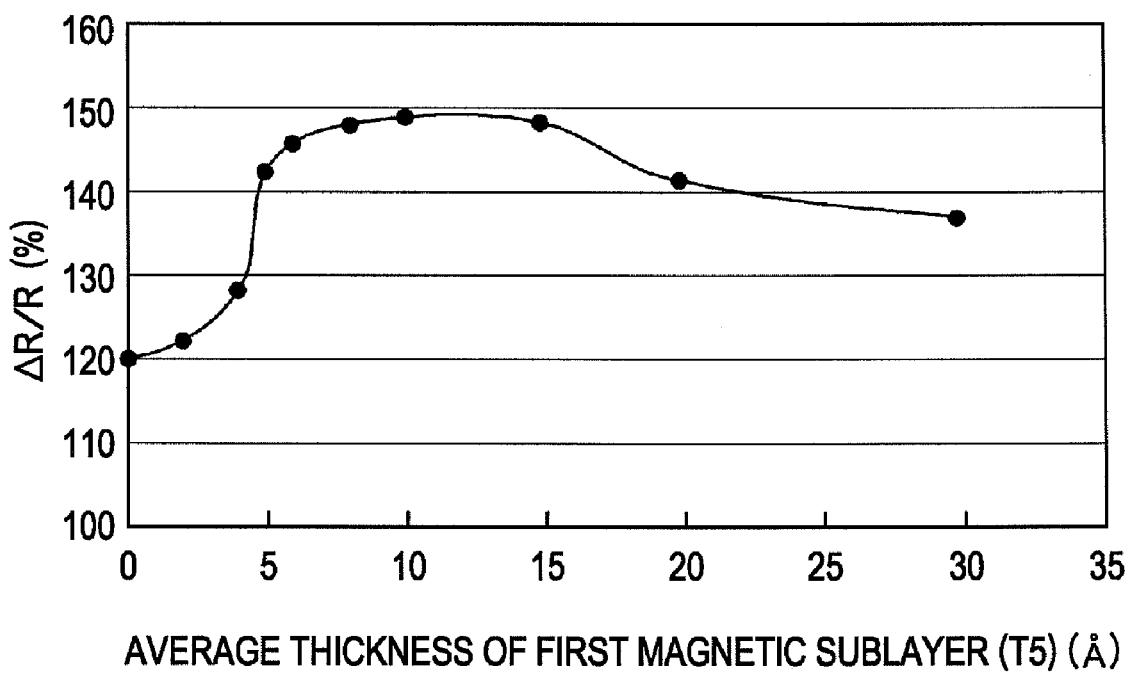
FIG. 9 is a graph showing the relationship between the average thickness of a first magnetic sublayer (Co—Fe) constituting the free magnetic layer and the rate of change in resistance ($\Delta R/R$).

FIG. 9 shows the relationship between the average thickness (t5) of the first magnetic sublayer (Co—Fe) and the rate of change in resistance (ΔR/R).

As shown in FIG. 9, the results demonstrated that when the average thickness of the first magnetic sublayer was set in the range of 5 Å to 30 Å, a high rate of change in resistance (ΔR/R) was stably obtained.

As shown in FIG. 9, the results demonstrated that when the average thickness of the first magnetic sublayer was set in the range of 10 Å to 20 Å, a high rate of change in resistance (ΔR/R) was obtained more stably.

As shown in Table 1, the results demonstrated that RA was in the range of 3 to 4 Ω·μm$^2$.

From the experimental results shown in FIGS. 8 and 9, it was preferred that the total average thickness obtained by the sum of the average thicknesses of the first and second magnetic sublayers (the average thickness of the entire free magnetic layer in the experiment) be set in the range of 15 Å to 80 Å, the average thickness (t5) of the first magnetic sublayer be set in the range of 5 Å to 30 Å, and the average thickness (t1) of the second magnetic sublayer be set to 5 Å or more.

More preferably, the total average thickness obtained by the sum of the average thicknesses of the first and second magnetic sublayers (the average thickness of the entire free magnetic layer in the experiment) was set in the range of 20 Å to 60 Å. More preferably, the average thickness (t5) of the first magnetic sublayer was set in the range of 10 Å to 20 Å. More preferably, the average thickness (t1) of the second magnetic sublayer was set to 10 Å or more.

What is claimed is:

1. A tunneling magnetic sensing element comprising:
   a pinned magnetic layer;
   an insulating barrier layer; and
   a free magnetic layer, the insulating layer being disposed between the pinned magnetic layer and the free magnetic layer;
   wherein the insulating barrier layer is composed of Mg—O,
   wherein the free magnetic layer has a first magnetic region and a second magnetic region, the first magnetic region is in contact with the insulating barrier layer, located between the second magnetic region and the insulating barrier layer, and composed of Co—Fe or Fe, and the second magnetic region is remote from the insulating barrier layer, in contact with the first magnetic region, and composed of Co—Fe—B or Fe—B, and
   wherein the second magnetic region has a compositionally modulated portion where the B concentration decreases gradually as the distance from the interface between the free magnetic layer and the insulating barrier layer decreases.

2. The tunneling magnetic sensing element according to claim 1, wherein the free magnetic layer has a laminated structure with a first magnetic sublayer and a second magnetic sublayer, the first magnetic sublayer is in contact with the insulating barrier layer, located between the second magnetic sublayer and the insulating barrier layer, and composed of Co—Fe or Fe, and the second magnetic sublayer is remote from the insulating barrier layer, in contact with the first magnetic sublayer, and composed of Co—Fe—B or Fe—B, and wherein the free magnetic layer has at least a portion formed by elemental diffusion at the interface between the first magnetic sublayer and the second magnetic sublayer.

3. The tunneling magnetic sensing element according to claim 2, wherein the total average thickness obtained by the sum of the average thickness of the first magnetic sublayer and the average thickness of the second magnetic sublayer is in the range of about 15 Å to about 80 Å, the first magnetic sublayer has an average thickness of about 5 Å to about 30 Å, and the second magnetic sublayer has an average thickness of about 5 Å or more.

4. The tunneling magnetic sensing element according to claim 3, wherein the total average thickness obtained by the sum of the average thickness of the first magnetic sublayer and the average thickness of the second magnetic sublayer is in the range of about 20 Å to about 60 Å.

5. The tunneling magnetic sensing element according to claim 3, wherein the first magnetic sublayer has an average thickness of about 10 Å to about 20 Å.

6. The tunneling magnetic sensing element according to claim 3, wherein the second magnetic sublayer has an average thickness of about 10 Å or more.

7. The tunneling magnetic sensing element according to claim 1, wherein the tunneling magnetic sensing element comprises:

the pinned magnetic layer;
the insulating barrier layer; and
the free magnetic layer, in that order from the bottom, and
wherein the pinned magnetic layer has a portion that is in contact with the insulating barrier layer, and at least the portion is composed of Co—Fe—B or Fe—B.

* * * * *